US 9,142,546 B2

(12) United States Patent
Shea et al.

(10) Patent No.: US 9,142,546 B2
(45) Date of Patent: Sep. 22, 2015

(54) METHOD OF MAKING BIPOLAR JUNCTION TRANSISTOR BY FORMING BASE EPITAXY REGION ON ETCHED OPENING IN DARC LAYER

(71) Applicants: Patrick B. Shea, Washington, DC (US); Michael Rennie, Mechanicsville, VA (US); Sandro J. Di Giacomo, Ellicott City, MD (US)

(72) Inventors: Patrick B. Shea, Washington, DC (US); Michael Rennie, Mechanicsville, VA (US); Sandro J. Di Giacomo, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 14/098,199

(22) Filed: Dec. 5, 2013

(65) Prior Publication Data
US 2015/0162322 A1 Jun. 11, 2015

(51) Int. Cl.
| | |
|---|---|
| *H01L 21/336* | (2006.01) |
| *H01L 21/331* | (2006.01) |
| *H01L 21/338* | (2006.01) |
| *H01L 21/337* | (2006.01) |
| *H01L 21/8249* | (2006.01) |
| *H01L 21/8222* | (2006.01) |
| *H01L 27/06* | (2006.01) |
| *H01L 27/092* | (2006.01) |
| *H01L 29/737* | (2006.01) |
| *H01L 29/66* | (2006.01) |
| *H01L 29/165* | (2006.01) |
| *H01L 21/02* | (2006.01) |
| *H01L 21/306* | (2006.01) |
| *H01L 21/265* | (2006.01) |

(52) U.S. Cl.
CPC ........ *H01L 27/0623* (2013.01); *H01L 21/0214* (2013.01); *H01L 21/02337* (2013.01); *H01L 21/02343* (2013.01); *H01L 21/02532* (2013.01); *H01L 21/02595* (2013.01); *H01L 21/26513* (2013.01); *H01L 21/30604* (2013.01); *H01L 27/092* (2013.01); *H01L 29/165* (2013.01); *H01L 29/66242* (2013.01); *H01L 29/7378* (2013.01)

(58) Field of Classification Search
None
See application file for complete search history.

(56) References Cited

U.S. PATENT DOCUMENTS

| | | | |
|---|---|---|---|
| 6,436,841 | B1 | 8/2002 | Tsai et al. |
| 6,979,884 | B2 | 12/2005 | Ahlgren et al. |
| 7,075,161 | B2 * | 7/2006 | Barth ............................ 257/414 |

(Continued)

OTHER PUBLICATIONS

Fox, et al.: "*SiGe:C HBT Architecture with Epitaxial External Base*" IEEE, 2011, 978-1-61284-166-3/11.

(Continued)

*Primary Examiner* — Michael Jung
(74) *Attorney, Agent, or Firm* — Tarolli, Sundheim, Covell & Tummino LLP

(57) ABSTRACT

A method is provided of forming a bipolar transistor device. The method comprises depositing a collector dielectric layer over a substrate in a collector active region, depositing a dielectric anti-reflective (DARC) layer over the collector dielectric layer, dry etching away a base opening in the DARC layer, and wet etching away a portion of the collector dielectric layer in the base opening to provide an extended base opening to the substrate. The method further comprises performing a base deposition to form a base epitaxy region in the extended base opening and extending over first and second portions of the DARC layer that remains as a result of the dry etching away the base opening in the DARC layer, and forming an emitter region over the base epitaxy region.

16 Claims, 9 Drawing Sheets

(56) References Cited

U.S. PATENT DOCUMENTS

| | | | |
|---|---|---|---|
| 7,402,485 B1 | 7/2008 | En et al. | |
| 8,236,662 B2 | 8/2012 | Feilchenfeld et al. | |
| 8,324,699 B2* | 12/2012 | Ichijo et al. | 257/431 |
| 8,426,728 B2* | 4/2013 | Zhao et al. | 136/264 |
| 2009/0206335 A1 | 8/2009 | Heinemann et al. | |
| 2009/0258500 A1* | 10/2009 | Yang et al. | 438/703 |
| 2013/0134483 A1* | 5/2013 | Adkisson et al. | 257/197 |
| 2013/0134484 A1* | 5/2013 | Chen et al. | 257/207 |

OTHER PUBLICATIONS

Rücker et al.: "*A 0.13 μm SiGe BiCMOS Technology Featuring $f_T/f_{max}$ of 240/330 GHz and Gate Delays Below 3 ps*" IEEE Journal of Solid-State Circuits, vol. 45, No. 9, Sep. 2010, pp. 1678-1686.

\* cited by examiner

METHOD OF MAKING BIPOLAR JUNCTION TRANSISTOR BY FORMING BASE EPITAXY REGION ON ETCHED OPENING IN DARC LAYER

TECHNICAL FIELD

The present invention relates generally to electronics, and more particularly to a bipolar junction transistor device and method of making the same.

BACKGROUND

Silicon-germanium (SiGe) heterojunction bipolar transistors (HBTs) and complementary metal oxide semiconductors (CMOS) combined together and referred to as BiCMOS circuits and systems are one of the most promising and ready technologies for ultra-high frequency applications in the radio frequency (RF) and terahertz (THz) range. SiGe BiCMOS devices and circuits have been demonstrated for frequencies as high as 600 GHz, and are capable of integrating multiple speed and power devices in single integrated circuits. The frequency and power ranges are tuned for a particular application by altering the device geometry (smaller devices being for higher frequency applications) and the base epitaxy thickness (thinner epitaxy being for higher frequency applications).

However, the processing of SiGe BiCMOS comprises several steps that require additional consideration compared to conventional processes. Importantly, deposition steps require underlying surfaces to be pristine silicon surfaces to ensure devices and circuits function properly and material is not wasted. Additionally, the multiple surfaces and subsequent deposition steps need to be uniform and repeatable over large areas. To ensure a pristine surface typically requires a cleaning step immediately prior to the layer deposition, but in SiGe BiCMOS structures an oxide layer with a window down to the substrate is typically present whose geometry is a critical dimension for performance. Thus, designing a process flow ensuring retention of that geometric integrity is a crucial enabling technology for reliable SiGe BiCMOS production. A hard mask layer can be introduced, but the usual layers used for hard masking are typically not appropriate. For example, silicon nitride would be a candidate, but its high permittivity increases the SiGe HBT base-to-collector capacitance (Cbc) that directly reduces device frequency performance.

SUMMARY

In accordance with one example, a method is provided of forming a bipolar transistor device. The method comprises depositing a collector dielectric layer over a substrate in a collector active region, depositing a dielectric anti-reflective (DARC) layer over the collector dielectric layer, dry etching away a base opening in the DARC layer, and wet etching away a portion of the collector dielectric layer in the base opening to provide an extended base opening to the substrate. The method further comprises performing a base deposition to form a base epitaxy region in the extended base opening and extending over first and second portions of the DARC layer that remains as a result of the dry etching away the base opening in the DARC layer, and forming an emitter region over the base epitaxy region.

In another example, a method is provided of forming a heterojunction bipolar transistor (HBT) and complementary metal oxide semiconductor (CMOS) (BiCMOS) device. The method comprises forming one or more CMOS devices in a first area of a silicon substrate, depositing a dielectric layer over the silicon substrate, depositing a nitride over the silicon substrate, and etching away a portion of the nitride layer in a second area of the substrate for forming a HBT to expose a portion of the dielectric layer that forms a collector dielectric layer over a collector active region, while still protecting the one or more CMOS devices. The method further comprises depositing a first dielectric anti-reflective (DARC) layer over the collector dielectric layer, dry etching away a base opening in the first DARC layer, and wet etching away a portion of the collector dielectric layer in the base opening to provide an extended base opening to the substrate. The method also comprises performing a base deposition to form a base epitaxy region in the extended base opening and extending over first and second portion of the first DARC layer that remain as a result of the dry etching away the base opening in the first DARC layer, depositing an emitter dielectric layer over base epitaxy region, depositing a second DARC over the emitter dielectric layer, dry etching away an emitter opening in the second DARC layer, and wet etching away a portion of the emitter dielectric layer in the emitter opening to provide an extended emitter opening to the base epitaxy region. The method further comprises performing an emitter material deposition to provide an emitter region in the extended emitter opening and extending over first and second portions of the second DARC layer that remain as a result of the dry etching away the emitter opening in the second DARC layer.

In yet another example, a heterojunction bipolar transistor (HBT) device is provided that comprises a collector dielectric layer overlying a silicon substrate in a collector active region, and a first dielectric anti-reflective (DARC) layer overlying the collector dielectric layer. The HBT comprises a base epitaxy region extending through a base opening through the collector dielectric layer and the first DARC layer and extending over first and second portions of the first DARC layer on opposing sides of the base opening. The base epitaxy region has a single crystal portion that overlies the silicon substrate and polysilicon regions on the opposing sides of the base opening. The HBT device also comprises an emitter dielectric layer overlying the base epitaxy region, a second DARC layer overlying the emitter dielectric layer, and a highly doped emitter material region extended though an emitter opening in contact with the single crystal portion and extending over first and second portions of the second DARC layer on opposing sides of the emitter opening. The HBT device comprises a base contact opening that extends through the highly doped emitter material region, the second DARC layer and the emitter dielectric to one or more doped polysilicon regions of the base epitaxy region, and an emitter contact opening that extends through the highly doped emitter material region, the second DARC layer and the emitter dielectric, the base epitaxy region, the first DARC layer and the collector dielectric layer to a doped collector contact region in the silicon substrate.

DETAILED DESCRIPTION

A bipolar transistor (BJT) device and method of making the same is disclosed. In one example, the BJT is a silicon-germanium (SiGe) heterojunction bipolar transistor (HBT) that is formed as a combination of one or more bipolar junction transistors (BJTs) and one or more complementary metal oxide semiconductors (CMOS) devices, known as BiCMOS (collectively, SiGe BiCMOS). SiGe BiCMOS circuits and systems provide a structure for ultra-high frequency applications in the RF and THz range, such as automotive radar, telecommunications, and THz imaging and detection. In order to reliably process SiGe BiCMOS circuits, the present disclosure describes the implementation of a dielectric anti-reflective coating (DARC) layer that is employed as a hard mask during foundry processing and as an integrated, permanent, durable layer during RF operation.

The DARC can be a dielectric silicon-rich oxynitride layer that satisfies multiple criteria for enabling SiGe BiCMOS fabrication and frequency performance. Specifically, the DARC holds advantages over other hard masks common in industry, namely silicon nitride. For example, the DARC layer serves as a hard mask during oxide wet etching, thus retaining the integrity of the device geometry, and also has a relatively low permittivity (dielectric constant of about 4), thus enabling higher frequency performance. Furthermore, the DARC layer serves as a dielectric anti-reflective coating during photolithography, thus improving the uniformity of lithographic processing, and is robust during the semiconductor foundry processing to not demonstrate trapping that would be deleterious to device performance.

Figure 1:
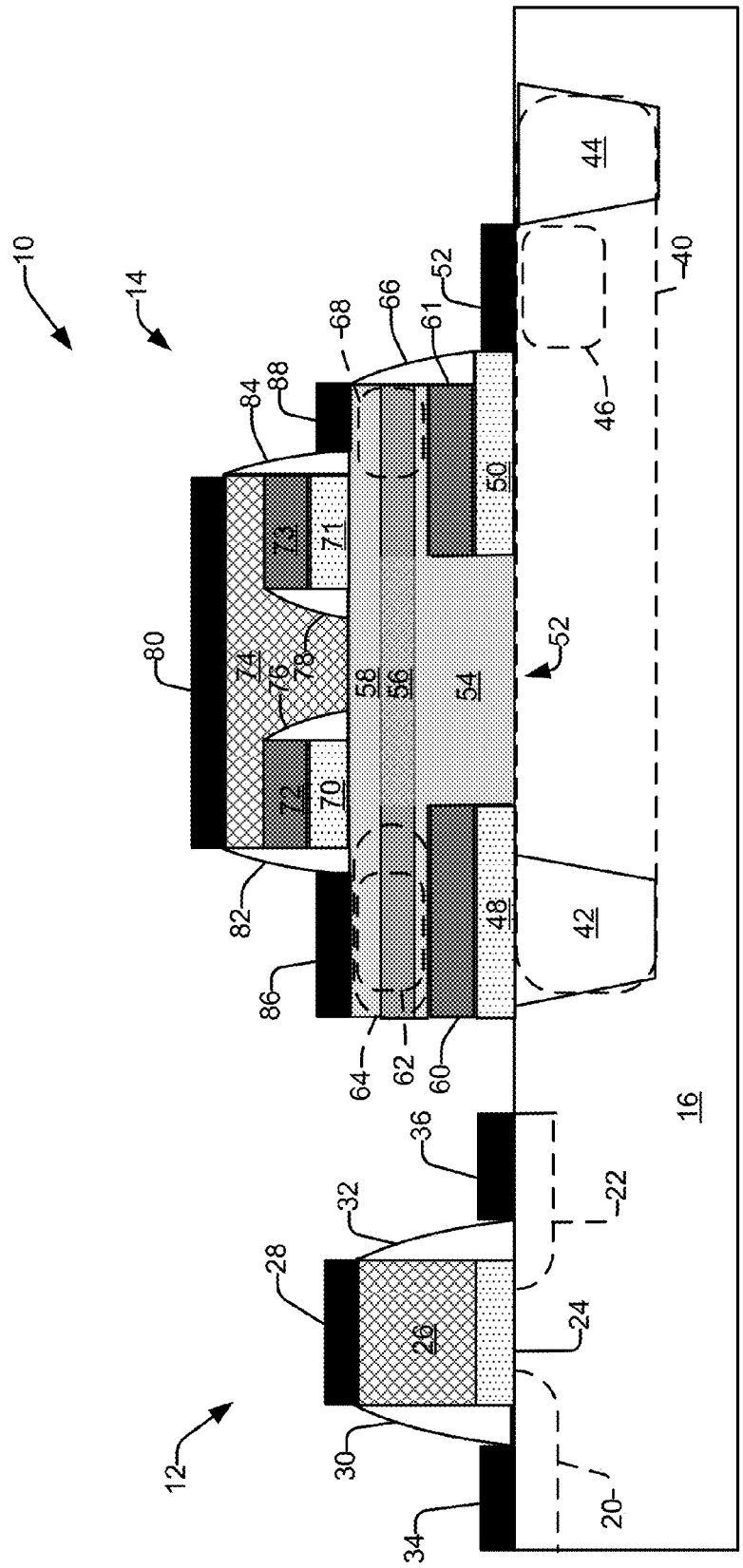
FIG. 1 illustrates a cross-sectional view of an example of a BiCMos device structure.

FIG. 1 illustrates a cross-sectional view of an example of a BiCMOS device structure 10. The device structure 10 includes a CMOS device 12 and a HBT device 14. The CMOS device 12 includes highly doped source and drain regions 20 and 22 residing in a shared substrate 16 (e.g., silicon) coupled to respective source and drain contacts 34 and 36, respectively. The CMOS device 12 also includes a gate contact 28 overlying a gate conductor layer 26 overlying a gate dielectric layer 24, and a pair of nitride spacers 30 and 32 extending up the sidewalls of the gate dielectric layer 24 and the gate conductor layer 26.

The HBT device 14 includes a collector active implant region 40 spaced between two collector isolation trenches 42 and 44, and a collector contact 52 disposed over a highly doped collector contact region 46 all residing in the shared substrate 16. A base epitaxy region 52 is disposed over a portion of the collector active implant region 40, and includes a lightly doped silicon collector interface region 54, a highly doped silicon germanium (e.g., boron) base layer 56 followed by another lightly doped silicon emitter interface layer 58. The base epitaxy region 52 extends between a pair of collector dielectric layers 48 and 50 and a first pair of DARC layers 60 and 61 with a first end of the base epitaxy region extending over the first DARC layer 60 of the pair of DARC layers and a second end of the base epitaxy region 52 extending over the second 61 of the pair of DARC layers on opposing sides of the base epitaxy region 52. A doped base region 64 and a highly doped base region 62 resides in the first end of the base epitaxy region 52, and a second highly doped base region 68 resides in the second end of the base epitaxy region 52. It is to be appreciated that that second highly doped base region 68 cold be substantially equivalent to highly doped base region 62 and doped base region 64 in a symmetric/double base contact device. A first base contact 86 resides over the first end of the base epitaxy region 52 and a second base contact 88 resides over the second end of the base epitaxy region 52. It is to be appreciated that the first base contact 86 and the second base contact 88 can be the same base contact, or formed from the same base contact layer, in, for example, a wrap around gate contact configuration.

An emitter active region 74 formed from highly doped polysilicon, or some other highly doped emitter material, extends between emitter dielectric layers 70 and 71 and a second pair of DARC layers 72 and 73. A first end of the emitter active region 74 extends over a first 72 of a second pair of DARC layers and a second end of the emitter active region 74 extends over a second 73 of the second of the pair of DARC layers on opposing sides of the emitter active region 74. A first pair of spacers 76 and 78 extends adjacent the central portion of the emitter active region 74, while a second pair of spacers 82 and 84 extend along outer side walls of the dielectric layers 70 and 71, the second pair of DARC layers 72 and 73, and the emitter active region 74. An emitter contact 80 is disposed over the emitter active region 74. As stated above, the first and second pairs of DARC layers are employed as hard masks during foundry processing of the HBT device 14.

Figure 2:
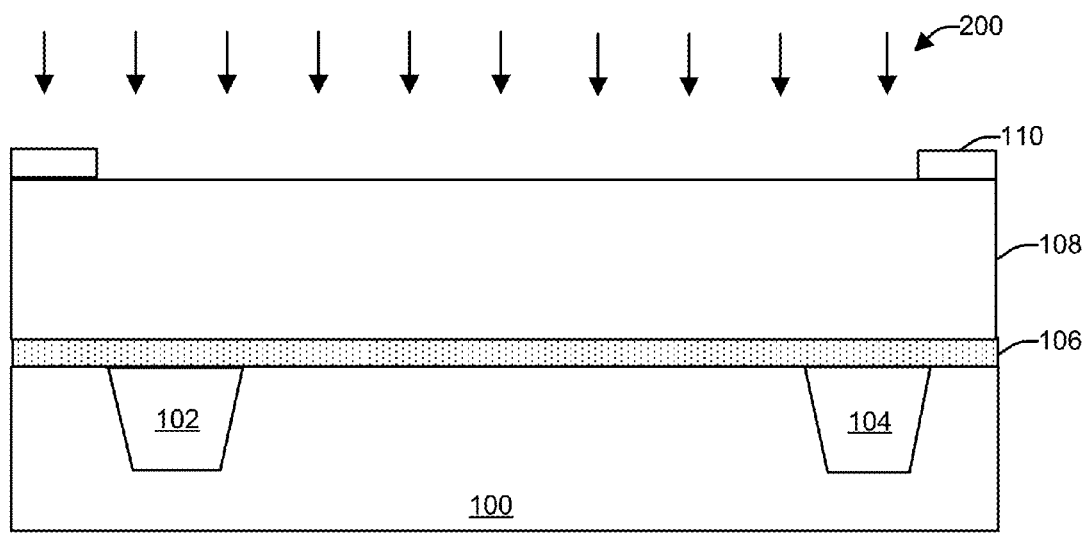
FIG. 2 illustrates a cross-sectional view of a semiconductor structure in its early stages of fabrication undergoing an etching process.
Figure 3:
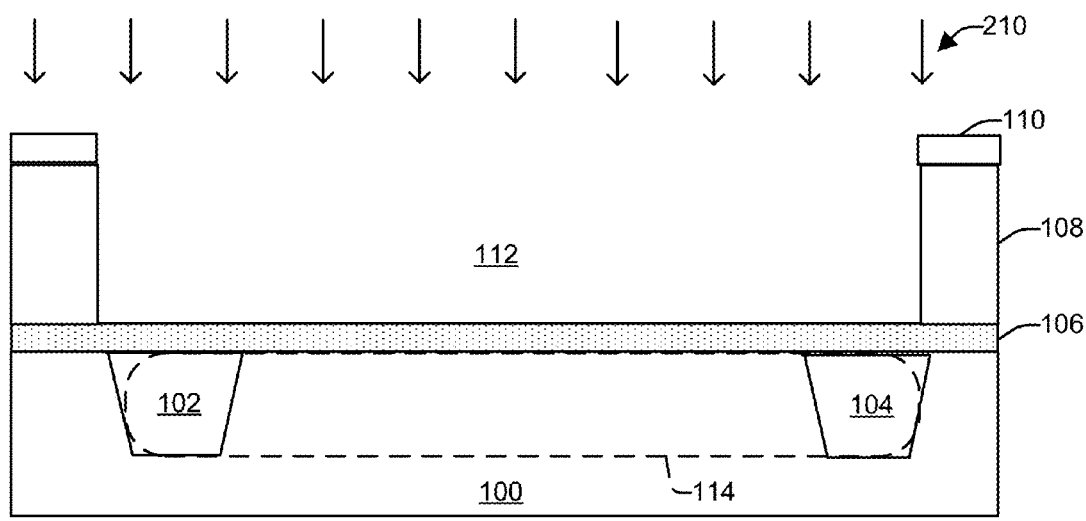
FIG. 3 illustrates a cross-sectional view of the resultant semiconductor structure of FIG. 2 undergoing a dopant implant.

Turning now to FIGS. 2-16, an example fabrication is discussed in connection with formation of a HBT device structure that can be formed in conjunction with other HBT devices and one or more CMOS devices as a BiCMOS device structure, such as the example device structure 10 illustrated in FIG. 1. FIG. 2 illustrates a cross-sectional view of a HBT structure in its early stages of fabrication. Trench isolation regions 102 and 104 are formed within a substrate 100 (e.g., silicon substrate). The trench isolation regions 102 and 104 are formed by etching (e.g., reactive ion etching) trenches selectively within portions of the substrate 100, and filling the trenches 102 and 104 with a dielectric fill material, such as tetraethylorthosilicate (TEOS). The TEOS material can then be chemically-mechanically polished (CMP) or planarized to provide resultant trench structures illustrated in FIG. 2. It is to be appreciated that alternative isolation schemes can be employed in place of the trench isolation regions 102 and 104, such as local oxidation of silicon (LOCOS). In the present example, the trench isolation regions 102 and 104 isolate a collector active region 114 (FIG. 3). After the trench isolation regions 102 and 104 are formed, a pre-gate clean up (not shown) is then performed on the substrate 100.

A collector dielectric layer 106 (e.g., silicon dioxide ($SiO_2$) layer about 150 Å thick) is formed over the substrate 100. Any suitable technique (e.g., thermal oxidation, plasma enhanced chemical vapor deposition (CVD), thermal enhanced CVD and spin on techniques) may be employed in forming the collector dielectric layer 106. Examples of CVD processes that may be utilized include Low Pressure CVD (LPCVD), Plasma Enhanced CVD (PECVD), and Rapid Thermal CVD (RTCVD). It is to be appreciated, that other types of thin layer formation can be employed, such as other deposition techniques (e.g., Physical Vapor Deposition (PVD)) and layer growth techniques.

A nitride layer 108 (e.g., about 1000 Å thick) is then formed over the collector dielectric layer 106. The collector dielectric layer 106 and nitride layer 108 can be employed as a protective stack for protecting a CMOS area during fabrication of the HBT device structure. Any suitable technique for forming the nitride layer 108 may be employed such as Low Pressure Chemical Vapor Deposition (LPCVD), Plasma Enhanced Chemical Vapor Deposition (PECVD), High Density Plasma Chemical Vapor Deposition (HDPCVD), or sputtering techniques to a thickness suitable for serving as a protective layer.

A photoresist material layer 110 is formed and patterned over the nitride layer 108. An etch 200 is performed on the nitride layer 108 underlying the photoresist material layer 110 to remove portions of the nitride layer 108 over the active collector region 114 of the HBT device area. The etching of the nitride layer 108 can be performed using a dry etch process that is designed to stop on the collector dielectric layer 106. For example, the nitride layer 108 can be anisotropically etched with a plasma gas(es), such as carbon tetrafluoride ($CF_4$) containing fluorine ions, in a commercially available etcher, such as a parallel plate RIE apparatus or, alternatively, an electron cyclotron resonance (ECR) plasma reactor. The resultant semiconductor structure is illustrated in FIG. 3.

Figure 4:
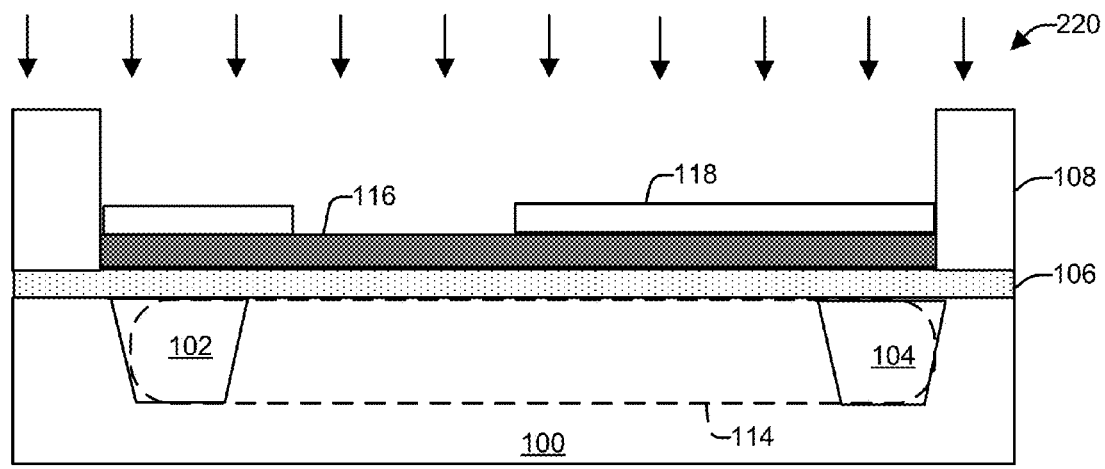
FIG. 4 illustrates a cross-sectional view of the resultant semiconductor structure of FIG. 3 after deposition of a dielectric antireflective coating (DARC) layer, deposition and patterning of a photoresist material layer over the DARC layer and undergoing an etching process.

FIG. 3 also illustrates the semiconductor structure undergoing an N-type dopant implant 210 (e.g., phosphorous implant) for forming the active collector region 114 between the trench isolation regions 102 and 104. The implant can be a moderate dose implant having a dose in the range of about $3 \times 10^{14}$ atoms/cm$^2$ and an energy range of about 100 KeV, or some other n-type dopant implant having a dose level and energy selected based on a given design. The photoresist material layer 110 is then stripped. Next as illustrated in FIG. 4, a DARC layer 116 (e.g., about 290 Å thick) is deposited over the dielectric layer and a photoresist material layer 118 is deposited and patterned over the DARC layer 116. The thickness of the DARC layer can vary based on an optical wavelength of the photolithography system and/or process being employed. A portion of the DARC layer 116 is then dry etched by etching process to form a hard mask and provide base opening 120. Advantageously, the silicon-rich oxynitride DARC layer 116 serves as an anti-reflective coating during photolithography, resulting in a more uniform and repeatable process across the wafer and multiple lots.

Figure 5:
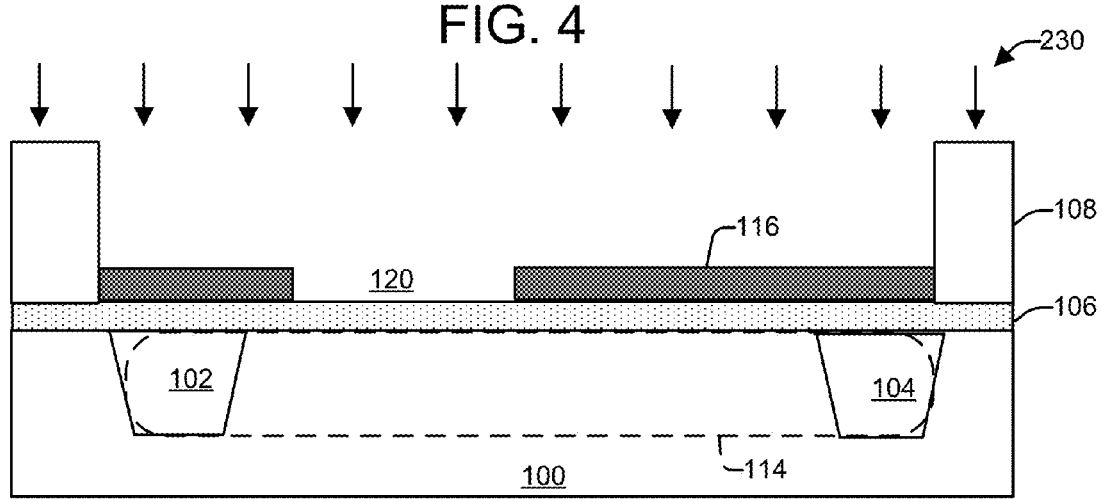
FIG. 5 illustrates a cross-sectional view of the resultant semiconductor structure of FIG. 4 after undergoing an etching process to form an opening in the DARC layer and undergoing a subsequent etching process.
Figure 6:
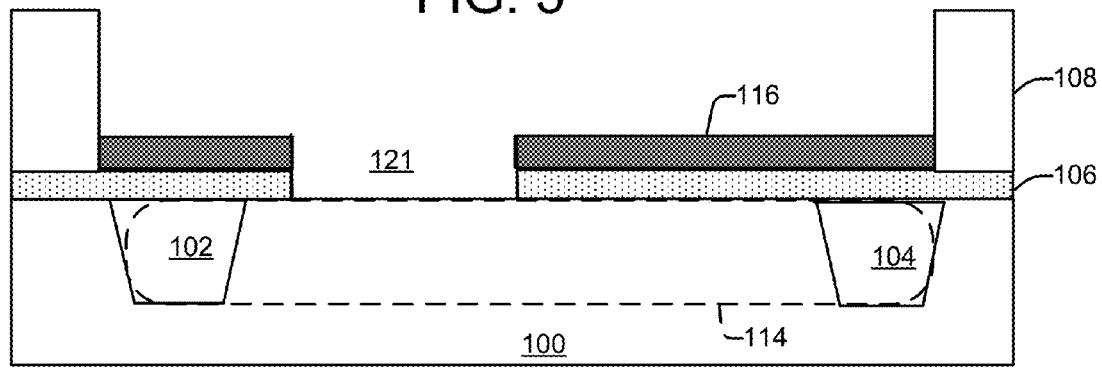
FIG. 6 illustrates a cross-sectional view of the resultant semiconductor structure of FIG. 5 after undergoing the subsequent etch process.

A partial timed etch of the collector dielectric layer 106 can be performed. The photoresist material layer 118 is then stripped and the wafer cleaned. The collector dielectric layer 106 is then wet etched in dilute hydrofluoric acid (HF) in a wet etch process 230 (e.g., for about 3.5 minutes in a 100:1 diluted HF concentration), as illustrated in FIG. 5 to remove the collector dielectric layer 106 down to the active collector region 114 to provide extended opening 121, leaving a pristine surface with the intended geometry intact. The resultant structure is illustrated in FIG. 6. A diluted HF clean can be again performed prior to base epitaxy region formation, so as to remove any native oxide that may form between the wafer being stripped of photoresist material and the base epitaxy region formation. The presence of the DARC layer 116 prevents the geometry from being damaged, and withstands the base epitaxy region formation.

Figure 7:
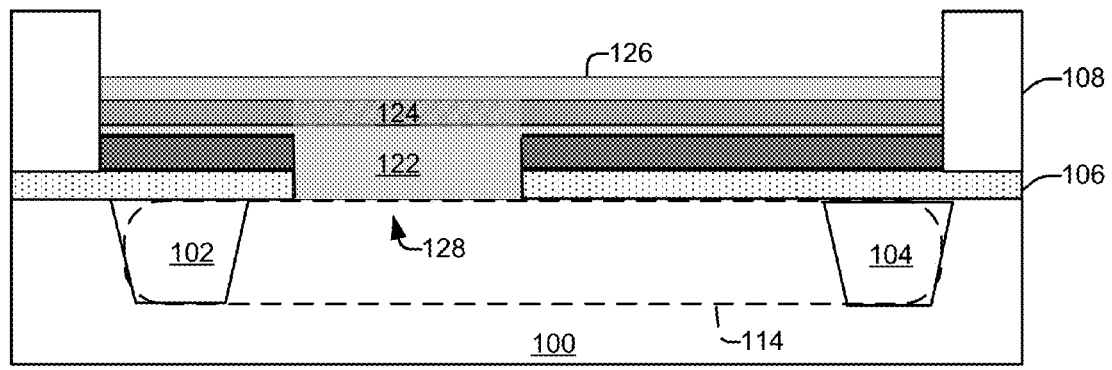
FIG. 7 illustrates a cross-sectional view of the resultant semiconductor structure of FIG. 6 after undergoing a base epitaxial region deposition process.

Next as illustrated in FIG. 7, lightly doped silicon is grown in base opening 121 to form lightly doped collector interface region 122, followed by growing highly doped silicon germanium (e.g., boron) base layer 126 followed by growing another lightly doped silicon emitter interface layer 126. Collectively, lightly doped collector interface region 122, highly doped silicon germanium base layer 126, and lightly doped silicon emitter interface layer 126 form a base epitaxy region 128. The portions of the base epitaxy region 128 directly overlying the substrate 100 form a single crystal structure, while the portions not over directly overlying the substrate 100 form a polycrystalline region. It is to be appreciated that the one or more of the layers of the base epitaxy region 128 could be doped after deposition as opposed to being deposited as a pre-doped material.

Figure 8:
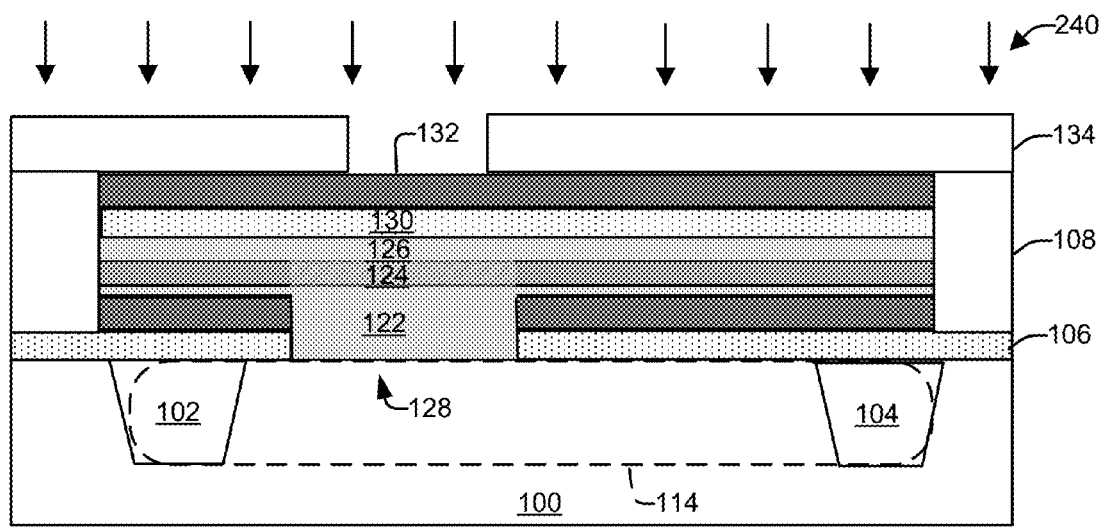
FIG. 8 illustrates a cross-sectional view of the resultant semiconductor structure of FIG. 7 after deposition of an etch dielectric layer, a second DARC layer, a photoresist material deposition and patterning and undergoing an etch process.
Figure 9:
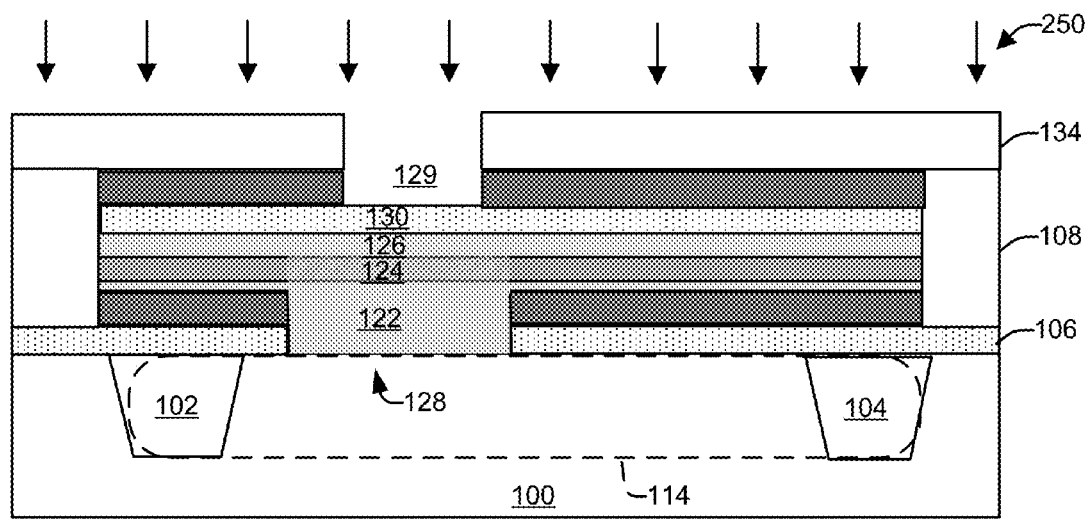
FIG. 9 illustrates a cross-sectional view of the resultant semiconductor structure of FIG. 8 after undergoing the etch process to remove a portion of the second DARC layer and undergoing a subsequent etch process to remove a portion of the emitter dielectric.

Next as illustrated in FIG. 8, an emitter dielectric layer 130 (e.g., about 700 Å of $SiO_2$) is deposited on top of the base epitaxial region 128. The emitter dielectric layer 230 can comprise single or multiple layers. A second DARC layer 132 (e.g., about 290 Å) is deposited on top of the emitter dielectric layer 130 and a photoresist material layer 134 is deposited over the second DARC layer 132, and patterned. Following the photolithography, the second DARC layer 132 is etched by a dry etching process 240 to form a hard mask with an opening 129 over the base epitaxy region 128. A partially timed dry etch can be performed on the emitter dielectric layer 130. The photoresist material layer 134 is then stripped. An emitter dielectric window 131 is opened down to the base epitaxy region 128 to provide extended opening 131 with a short diluted HF acid wet etch (e.g., for about 3.5 minutes at a concentration of 100:1), as illustrated in FIG. 9. A diluted HF clean can be performed immediately prior to an emitter polysilicon deposition to remove any native oxide formed between cleaning the wafer and the polysilicon deposition for forming the emitter. The DARC layer 132 withstands the final HF dip and polysilicon deposition, thus enabling retention of the important emitter dielectric window geometry.

Figure 10:
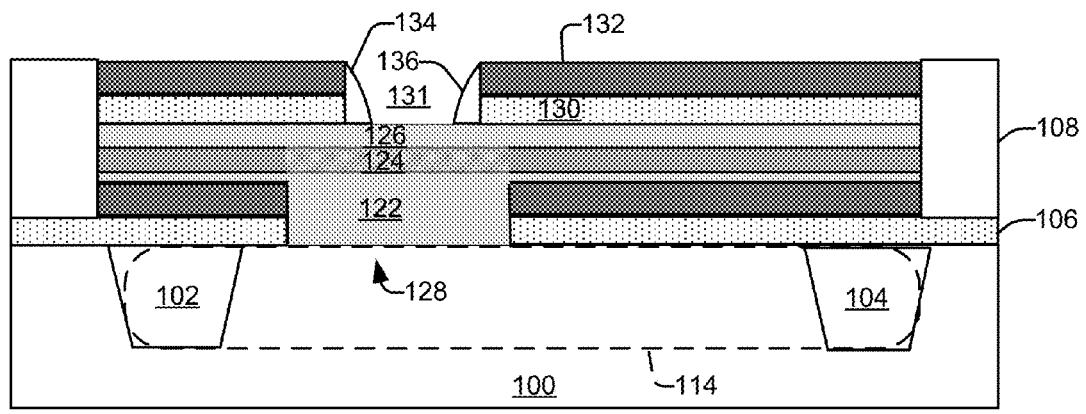
FIG. 10 illustrates a cross-sectional view of the resultant semiconductor structure of FIG. 9 after undergoing the subsequent etch process and after the formation of nitride spacers.
Figure 11:
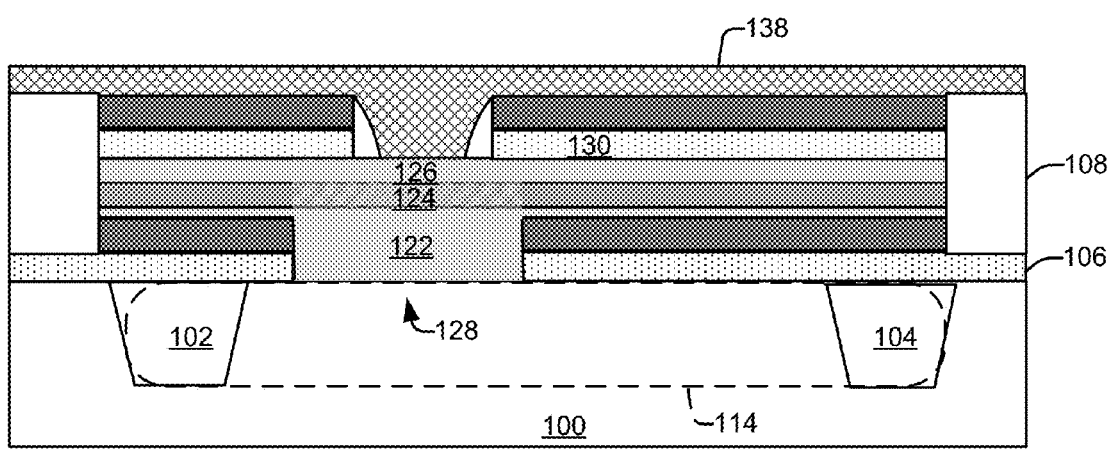
FIG. 11 illustrates a cross-sectional view of the resultant semiconductor structure of FIG. 10 after undergoing a polysilicon emitter deposition process.
Figure 12:
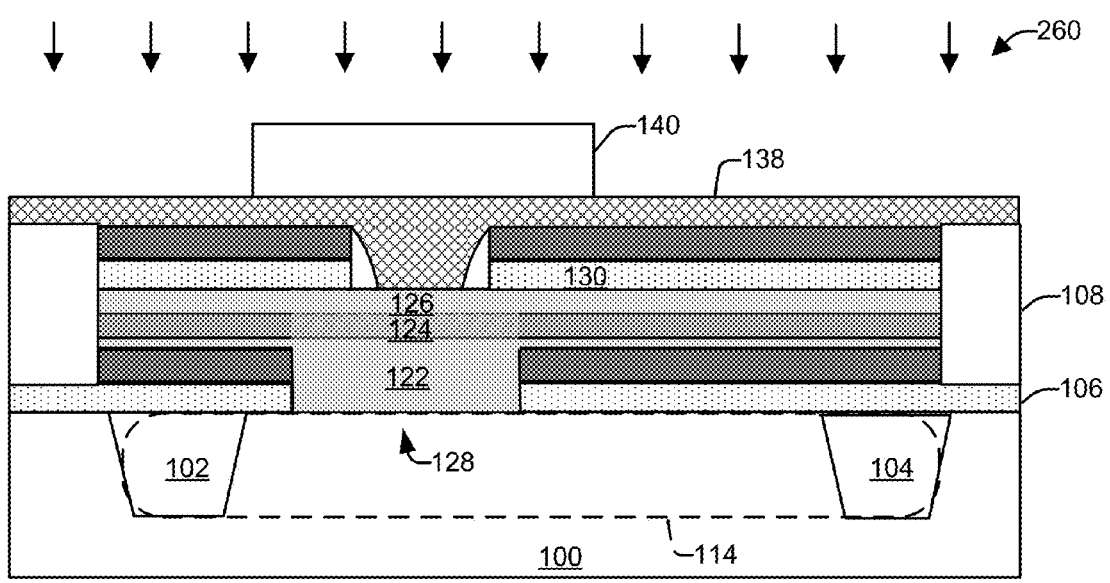
FIG. 12 illustrates a cross-sectional view of the structure of FIG. 11 after deposition and patterning of a photoresist material layer and undergoing an etch process to remove unwanted portion of the polysilicon layer, the DARC layer and the emitter dielectric layer.
Figure 13:
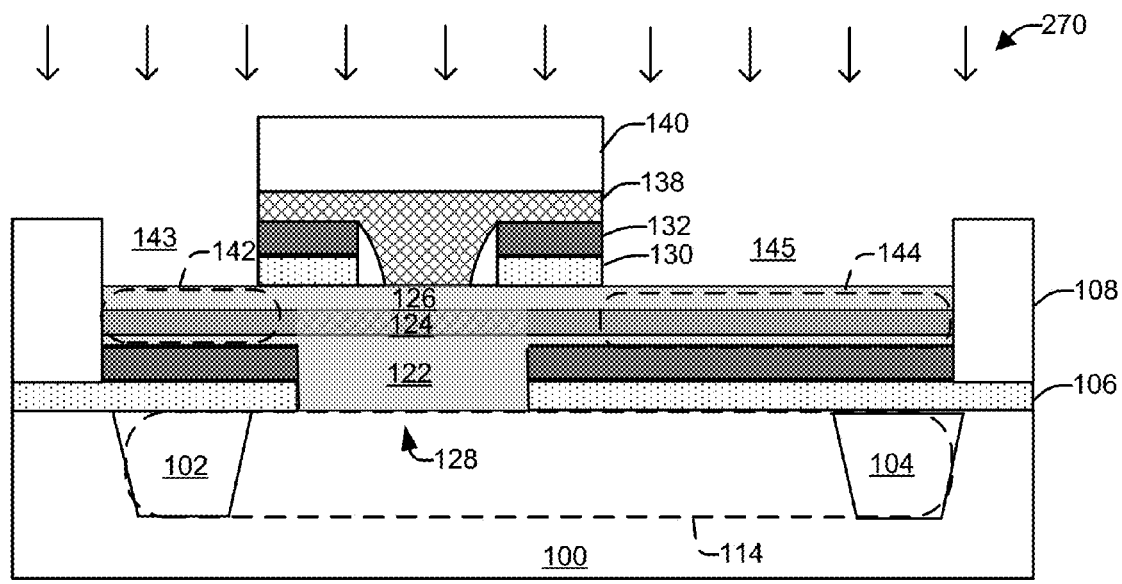
FIG. 13 illustrates a cross-sectional view of the resultant semiconductor structure of FIG. 12 after the etching process and also undergoing a dopant implant.

FIG. 10 illustrates the structure of FIG. 9 after the wet etch 250 and formation of nitride spacers 134 and 136. Next, a layer of highly doped (e.g., arsenic implanted) polysilicon emitter material 138 is deposited (e.g., about 2000 Å thick) over the structure of FIG. 10, as illustrated in FIG. 11. It is to be appreciated that other types of emitter material could be employed in addition to polysilicon. A photoresist material layer 140 is then deposited and patterned as shown in FIG. 12. FIG. 12 also illustrates the semiconductor structure undergoing an etching process 260 to remove unwanted portions of the extrinsic polysilicon emitter layer 138, the emitter dielectric layer 130 and the DARC layer 132. FIG. 13 illustrates the resultant structure after the etching process 260. FIG. 13 also illustrates the resultant structure undergoing a dopant implant 270 to form doped extrinsic base regions 142 and 144. The dopant implant can be a dose of boron fluoride ($BF_2$) of approximately $5.0\ E^{14}$ atoms/cm$^2$ at about 15 KeV, or any p-type dopant implant having a dose level and an energy level that is selected based on a given design. The photoresist material layer 140 is removed, and a second pair of nitride spacers 139 and 141 are formed.

Figure 14:
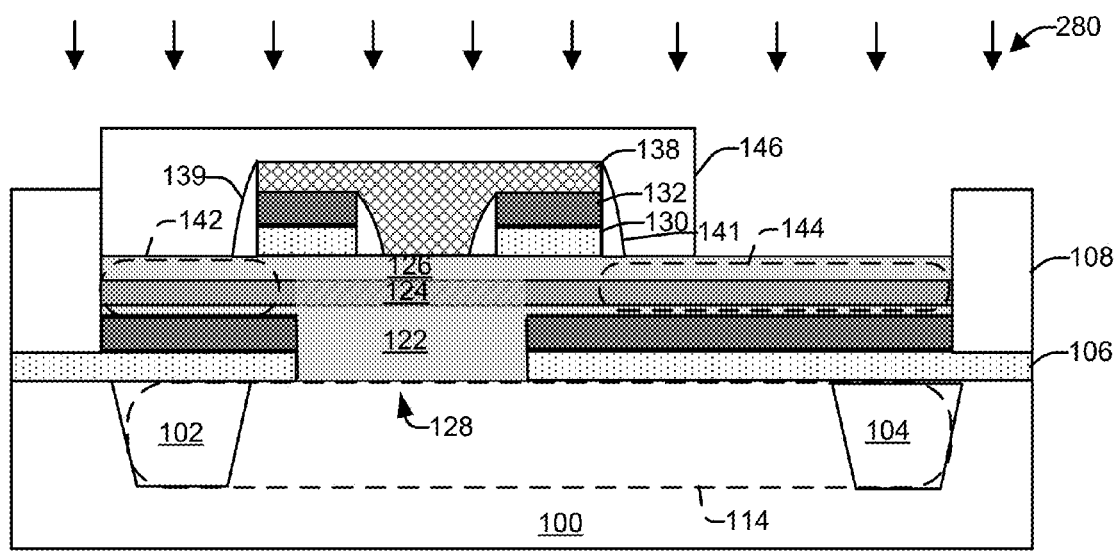
FIG. 14 illustrates a cross-sectional view of the structure of FIG. 13 after the undergoing a dopant implant, after formation of spacers, after undergoing another photoresist material deposition and patterning and undergoing another etch process to remove unwanted portions of the extrinsic base epitaxy.
Figure 15:
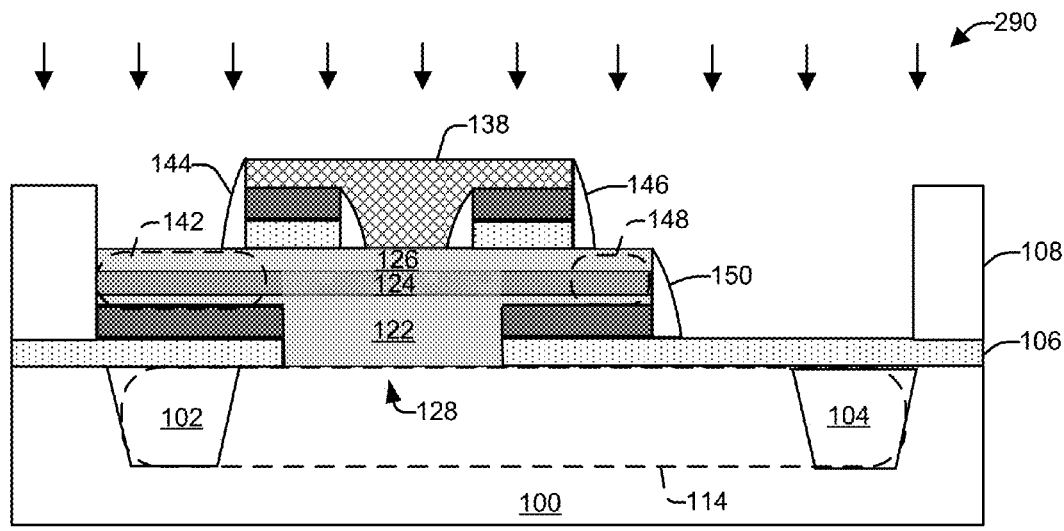
FIG. 15 illustrates a cross-sectional view of the resultant semiconductor structure of FIG. 14 after the etching process and also undergoing a subsequent etching process to remove portions of the collector dielectric.
Figure 16:
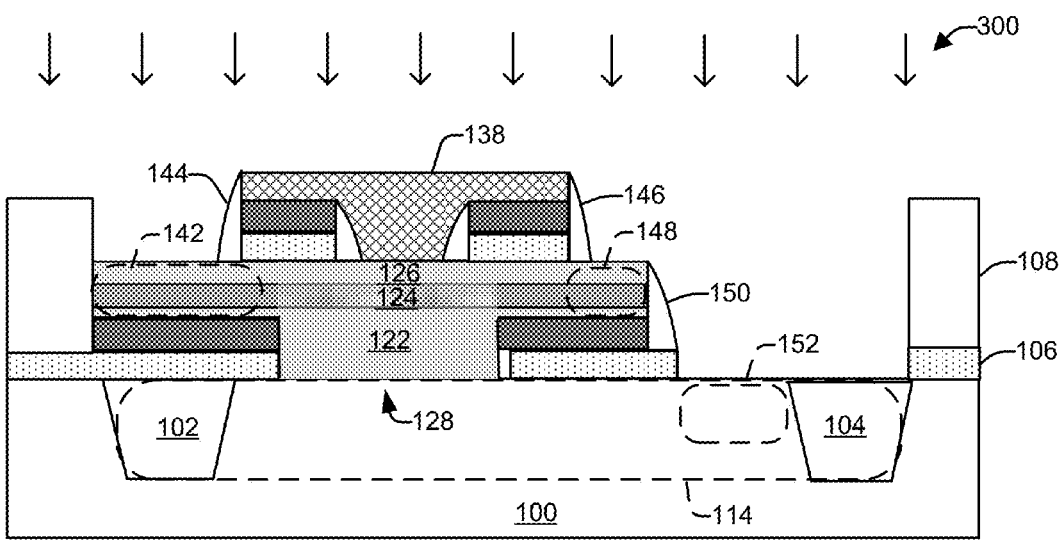
FIG. 16 also illustrates the resultant semiconductor structure of FIG. 15 undergoing another dopant implant to form a collector contact region.
Figure 17:
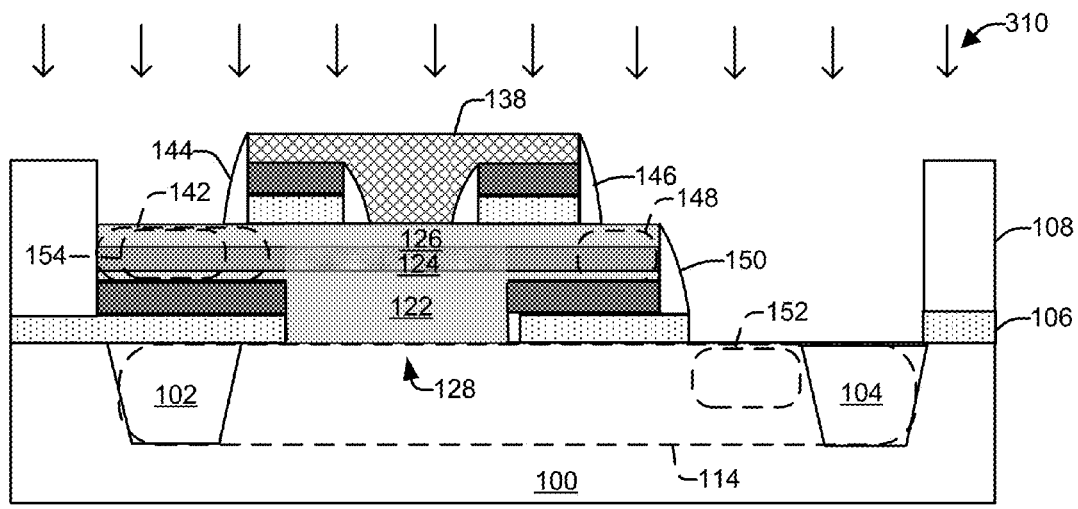
FIG. 17 illustrates the resultant semiconductor structure of FIG. 16 undergoing another dopant implant to form highly doped base contact regions.
Figure 18:
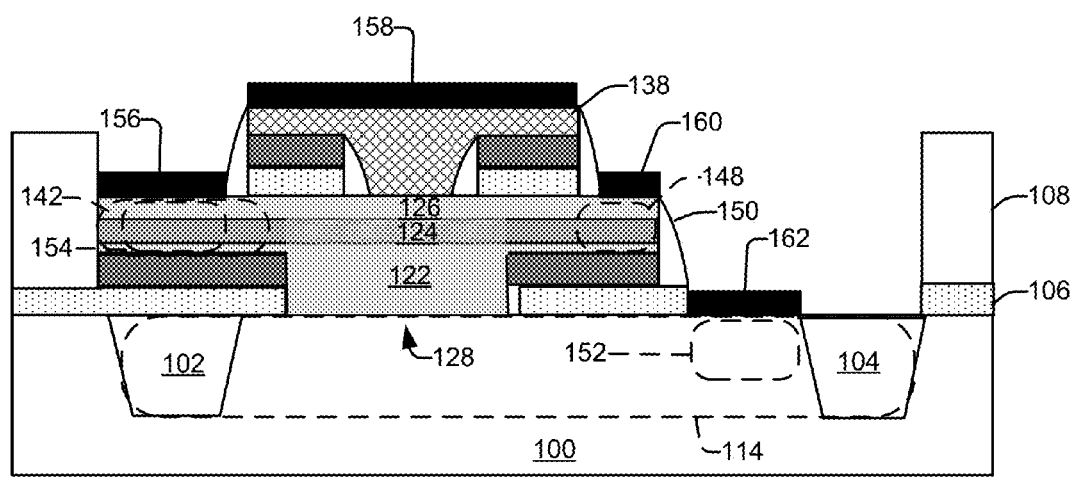
FIG. 18 illustrates the resultant semiconductor structure of FIG. 17 after formation of base contacts, an emitter contact and a collector contact.

As shown in FIG. 14, another photoresist material layer 146 is deposited and patterned over the semiconductor structure and an etching process 280 is performed to remove a portion of the extrinsic base region 144 over the collector contact region. As illustrated in FIG. 15, a nitride spacer 150 is formed and an etching process is performed to remove portions of the collector dielectric layer 106 in the removed portions of the extrinsic base region (FIG. 16). FIG. 16 also illustrates the semiconductor structure undergoing another dopant implant 300 to form collector contact region 152. This implant can be the same implant during implants of N-type source and drains for any CMOS devices being formed concurrently with the HBT device. FIG. 17 illustrates the semiconductor structure undergoing another dopant implant 310 to form highly doped base contact regions 154. This implant can be the same implant during implants of P-type source and drains for any CMOS devices being formed concurrently with the HBT device. A salicide formation provides base contacts 156 and 160, emitter contact 158 and collector contact 162, as illustrated in the final resultant structure of FIG. 18.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a bipolar transistor device, the method comprising:
   depositing a collector dielectric layer over a substrate in a collector active region;
   depositing a dielectric anti-reflective (DARC) layer over the collector dielectric layer;
   dry etching away a base opening in the DARC layer;
   wet etching away a portion of the collector dielectric layer in the base opening to provide an extended base opening to the substrate;
   performing a base deposition to form a base epitaxy region in the extended base opening and extending over first and second portions of the DARC layer that remains as a result of the dry etching away the base opening in the DARC layer, wherein the base deposition comprises:
      forming a doped collector interface region over the substrate in the extended base opening;
      forming a doped silicon germanium base layer over the doped collector interface region; and
      forming a doped emitter interface region over the doped silicon germanium base layer; and
   forming an emitter region over the base epitaxy region.

2. The method of claim 1, wherein the forming an emitter region comprises:
   depositing an emitter dielectric layer over the base epitaxy region;
   depositing a second dielectric DARC layer over the emitter dielectric layer;
   dry etching away an emitter opening in the second DARC layer;
   wet etching away a portion of the emitter dielectric layer in the emitter opening to provide an extended emitter opening to the base epitaxy region; and
   performing an emitter material deposition to provide the emitter region in the extended emitter opening and extending over first and second portions of the second DARC layer that remain as a result of the dry etching away the emitter opening in the second DARC layer.

3. The method of claim 2, further comprising:
   etching away portions of the emitter material, the first and second portions of the second DARC layer, and the emitter dielectric layer down to the base epitaxy region;
   implanting dopant in the base epitaxy region on opposing sides of the base opening to form doped extrinsic base regions;
   etching away a portion of the doped extrinsic base region to form a collector contact region down to the collector dielectric layer;
   implanting dopant in a portion of the collector active region to form a doped collector contact region in the substrate; and
   etching a portion of the collector dielectric layer over the doped collector contact region.

4. The method of claim 3, wherein the emitter material is highly doped polysilicon.

5. The method of claim 3, further comprising forming an emitter contact over the emitter material, a base contacts over the doped extrinsic base regions and a collector contact over the doped collector contact region.

6. The method of claim 1, wherein the DARC layer is formed from a silicon-rich oxynitride layer that functions as both a hard mask and an anti-reflective layer during photolithography.

7. The method of claim 6, wherein silicon-rich oxynitride layers have a dielectric constant of 4.

8. The method of claim 1, wherein a portion of the collector dielectric layer is dry etched before performing the wet etching.

9. A method of forming a heterojunction bipolar transistor (HBT) and complementary metal oxide semiconductor (CMOS) (BiCMOS) device, the method comprising:
   forming one or more CMOS devices in a first area of a silicon substrate;
   depositing a dielectric layer over the silicon substrate;

depositing a nitride over the silicon substrate;

etching away a portion of the nitride layer in a second area of the substrate for forming a HBT to expose a portion of the dielectric layer that forms a collector dielectric layer over a collector active region, while still protecting the one or more CMOS devices;

depositing a first dielectric anti-reflective (DARC) layer over the collector dielectric layer;

dry etching away a base opening in the first DARC layer;

wet etching away a portion of the collector dielectric layer in the base opening to provide an extended base opening to the substrate;

performing a base deposition to form a base epitaxy region in the extended base opening and extending over first and second portion of the first DARC layer that remain as a result of the dry etching away the base opening in the first DARC layer;

depositing an emitter dielectric layer over the base epitaxy region;

depositing a second DARC over the emitter dielectric layer;

dry etching away an emitter opening in the second DARC layer;

wet etching away a portion of the emitter dielectric layer in the emitter opening to provide an extended emitter opening to the base epitaxy region; and performing an emitter material deposition to provide an emitter region in the extended emitter opening and extending over first and second portions of the second DARC layer that remain as a result of the dry etching away the emitter opening in the second DARC layer.

10. The method of claim 9, further comprising:

etching away portions of the emitter material, the first and second portions of the second DARC layer, and the emitter dielectric layer down to the base epitaxy region;

implanting dopant in the base epitaxy region to form one or more doped extrinsic base regions, while concurrently doping one of source and drain regions of the one or more CMOS devices;

etching away a portion of the doped extrinsic base region to form a collector contact region down to the collector dielectric layer;

implanting dopant in a portion of the collector active region to form a doped collector contact region in the substrate, while concurrently doping the other of source and drain regions of the one or more CMOS devices; and etching a portion of the collector dielectric layer over the doped collector contact region.

11. The method of claim 9, wherein the emitter material is highly doped polysilicon.

12. The method of claim 9, further comprising forming an emitter contact over the emitter material, one or more base contacts over the doped extrinsic base regions and a collector contact over the doped collector contact region.

13. The method of claim 9, wherein the first DARC layer and second DARC layer are formed from a silicon-rich oxynitride layer that both function as hard masks and anti-reflective layers during photolithography.

14. The method of claim 13, wherein silicon-rich oxynitride layers have a dielectric constant of 4.

15. The method of claim 9, wherein a portion of the collector dielectric layer and the emitter dielectric layer are dry etched before performing the wet etching.

16. The method of claim 9, wherein the base deposition comprises:

forming a lightly doped collector interface region over the substrate in the extended opening;

forming a highly doped silicon germanium base layer over the lightly doped collector interface region; and forming a lightly doped emitter interface region over the highly doped silicon germanium base layer.

* * * * *